(12) United States Patent
Smith et al.

(10) Patent No.: US 6,678,878 B2
(45) Date of Patent: Jan. 13, 2004

(54) INTELLIGENT MILLING PATH CREATION FOR PANELIZATION ABSTRACT

(76) Inventors: Daniel J. Smith, 1229 Manchester Dr., Crystal Lake, IL (US) 60014; Eric C. Mace, 309 Anchor Dr., Carpentersville, IL (US) 60110

( * ) Notice: Subject to any disclaimer, the term of this patent is extended or adjusted under 35 U.S.C. 154(b) by 0 days.

(21) Appl. No.: 10/090,645

(22) Filed: Mar. 4, 2002

(65) Prior Publication Data

US 2003/0167453 A1 Sep. 4, 2003

(51) Int. Cl.[7] ............................................. G06F 17/50
(52) U.S. Cl. ....................................................... 716/15
(58) Field of Search ............................................ 716/15

(56) References Cited

U.S. PATENT DOCUMENTS

| | | | | |
|---|---|---|---|---|
| 5,508,887 A | * | 4/1996 | Ozaki | 361/752 |
| 5,515,240 A | * | 5/1996 | Rodeffer et al. | 361/759 |
| 5,563,443 A | * | 10/1996 | Beng et al. | 257/666 |
| 5,887,158 A | * | 3/1999 | Sample et al. | 716/15 |
| 6,376,779 B1 | * | 4/2002 | Shearman et al. | 174/261 |
| 6,378,857 B1 | * | 4/2002 | Taylor | 269/47 |
| 6,460,170 B1 | * | 10/2002 | Shaeffer et al. | 716/15 |
| 6,548,756 B2 | * | 4/2003 | Jones et al. | 174/52.1 |

OTHER PUBLICATIONS

Paul Draxler, CAD of Integrated Passives on Printed Circuit Boards Through Utilization of Multiple Materials Domains. 2002 IEEE MTT–S Digest, pp. 2097–2100 (IF–TH–29).*

* cited by examiner

Primary Examiner—Matthew Smith
Assistant Examiner—Andrea Liu
(74) Attorney, Agent, or Firm—Banner & Witcoff, Ltd.

(57) ABSTRACT

A method is disclosed to integrate the creation of a milling path into printed circuit board (PCB) design. The method includes creating keepout regions based on a PCB outline and critical components components placed on the PCB design, calculating support tabs based on the created keepout regions, and then placing the support tabs along the border as calculated. A milling machine may then mill out the support tabs as designed without suffering the potentially undetectable defects in the milling process.

27 Claims, 12 Drawing Sheets

INTELLIGENT MILLING PATH CREATION FOR PANELIZATION ABSTRACT

COPYRIGHT NOTICE

A portion of the disclosure of this patent document may contain material which is subject to copyright protection. To the extent that it does, the copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright © 2002, Mentor Graphics Corp., All Rights Reserved.

FIELD OF THE INVENTION

This invention relates to the field of printed circuit board design, and more specifically, to a mechanism for automatically and intelligently creating milling paths for breaking out boards from a panel.

BACKGROUND OF THE INVENTION

A PCB starts out as a schematic in which the PCB functionality is laid out as a logical diagram of symbolic representations. When the schematic is finished, the schematic is interpreted, or captured, into a PCB design of physical components that make up the PCB functionality as detailed in the schematics. The PCB design may then be manufactured into an electrical circuit.

For economic reasons, many PCB designs are typically placed on a single panel during the manufacturing process, and each design is then populated with the components to form an electrical circuit. Once the populated PCBs have been tested, they must be broken out from the panel. Under the existing state of the art, there are three processes for creating those board breakout patterns from the panel: scoring, shearing, and milling.

Shearing is the process where a panel is placed into a shearing cutter (guided by a pair of guide pins on each side), and the board is sheared cleanly. Shearing is used to create rectangular profile boards, and is normally done by performing all cuts of the longest sides of the panel, and then the remaining shorter sides.

Disadvantages of the shearing process include: 1) the cost of the shearing machine; 2) additional workstation setup for a factory floor; 3) high probability of solder stress fractures to the solder joints caused by excessive shearing force, which can result in soldered parts breaking off the board; and 4) on thicker boards, the potential exists for delaminating the traces and copper areas caused by stress induced shearing.

Scoring is a circuit board fabrication method used to make long, straight cuts along the entire length and/or width of a panel, and therefore is often used to create rectangular profile board shapes. Scoring is the process where a "V" groove (usually no more than 0.005" wide on the surface of the panel) is cut $\frac{1}{3}^{rd}$ into the top of the panel along an entire X or Y coordinate, and a "V" groove is cut $\frac{1}{3}^{rd}$ into the bottom of the panel along the identical X or Y coordinate. What is left is the middle $\frac{1}{3}^{rd}$ of the panel itself, and this is normally thick enough to endure the rigors of assembly and soldering, but easy enough to break by placing the panel into a single grooved fixture that will allow an operator to snap the unused panel material away from the finished boards.

Disadvantages of scoring include: 1) most PCB fabricators do not perform this process within their factories, which adds to the cost of manufacturing the PCB, as well as delays in delivery, for example; 2) it is very difficult to maintain a consistent depth of scoring if the panel has experienced any warpage during fabrication/shipping.

Another disadvantage of the scoring and shearing processes is that they are designed for breaking out square or rectangular PCBs, and therefore, do not properly address the need for PCBs to custom fit new enclosures. Another breakout process, called milling, is able to address this need. Milling requires the creation of a milling path around the entire PCB outline, interrupted by support tabs placed at predetermined distances around the board outline. A router with a single diameter drill bit is then used to cut out the board along the milling path.

Support tabs, which can be created with a combination of milling and drilling, help the panel remain rigid throughout all assembly and soldering processes. Support tabs are designed to be easily cut open by either pneumatic or hand-held cutters after the assembly and soldering of the panel has been completed. Historically, within CAD (Computer Aided Design) tools, support tabs have been created uniquely (i.e., one by one), or have been saved as a pre-route pattern template that can be placed repeatedly along a board outline.

One of the problems with using milling in this manner is being able to place support tabs where they do not cause assembly problems, or problems further in the process. For example, the placement of a protruding support tab underneath a protruding component may seem like a logical place for placing the support tab. However, the fabricator may not recognize that the protruding component must fit in a card cage, and a protruding support tab would prevent such functionality.

More recently, panels have been designed with internal support tabs, i.e., support tabs that are located within the board outline. One of the advantages of this process is that the entire edge feature is true to the board outline once it is broken off from the panel. Some of the disadvantages are that 1) the internal support tabs use valuable PCB design area; and 2) the pre-routes are typically not attempted until the PCB design is completed.

SUMMARY OF THE INVENTION

In one aspect of the invention is a method for intelligently and automatically creating milling paths. The method includes creating keepout regions on a PCB design having a PCB outline and critical components placed thereon, the keepout regions based on the outline and critical components; calculating support tab placements in accordance with the keepout regions; and placing support tabs on the PCB design in accordance with the calculated support tab placements.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
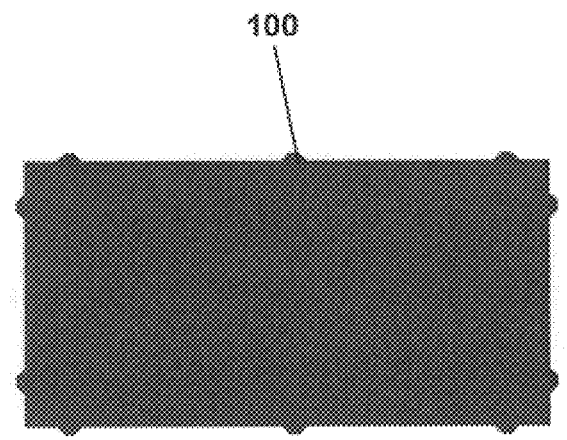
FIG. 1 is a block diagram illustrating a PCB having a convex support tab.

In one aspect of the invention is a method for automatically and intelligently creating milling paths by strategically placing support tabs around a PCB outline during the PCB design process. The method comprises creating keepout regions based on a board outline and critical components placed on a PCB design, and then calculating support tabs to be placed on the PCB design in accordance with the keepout regions. Support tabs can then be generated on the PCB design in accordance with the calculated support tab placements. Upon completing a panel, a milling machine may then cut the boards out along the milling path comprising the board outline and support tabs.

The present invention includes various operations, which will be described below. The operations of the present invention may be performed by hardware components or may be embodied in machine-executable instructions, which may be used to cause a general-purpose or special-purpose processor or logic circuits programmed with the instructions to perform the operations. Alternatively, the operations may be performed by a combination of hardware and software.

The present invention may be provided as a computer program product which may include a machine-readable medium having stored thereon instructions which may be used to program a computer (or other electronic devices) to perform a process according to the present invention. The machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electromagnetic Erasable Programmable Read Only Memories), magnetic or optical cards, flash memory, or other type of media / machine-readable medium suitable for storing electronic instructions.

Moreover, the present invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection). Accordingly, herein, a carrier wave shall be regarded as comprising a machine-readable medium.

Introduction

Panelization is the process of arranging a specific PCB design onto a larger carrier, or panel, that is used through the manufacturing process. Since it is more feasible and economical to place several board designs on a single panel, there must also exist ways for breaking out the boards from the panel once they are populated and tested.

The milling process involves using a router tool to cut into a finished panel and removing the PCB material at areas of the panel where there are no support tabs. Support tabs are PCB material that sustain the weight of components being placed on the board and provide mechanical stability for the board as it goes through various assembly and soldering processes.

Figure 2:
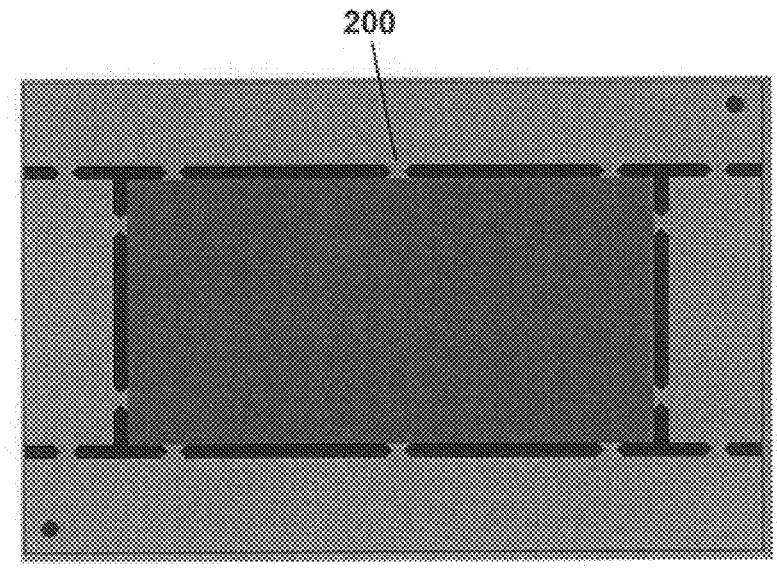
FIG. 2 is a block diagram illustrating how the PCB of FIG. 1 is routed in a panel.

There are two types of support tabs. As illustrated in FIG. 1, a support tab 100 may stick out beyond the defined board outline. As illustrated in FIG. 2, this type of support tab is normally created when a router stops its routing along the path of the board outline, and then restarts the routing along the same board edge. This restart point 200 is a predetermined distance that is typically two times the material thickness of the panel. As one of ordinary skill in the art would understand, however, the predetermined distance may be some other measure. As used throughout the description, these types of support tabs will be referred to as convex support tabs.

Figure 3:
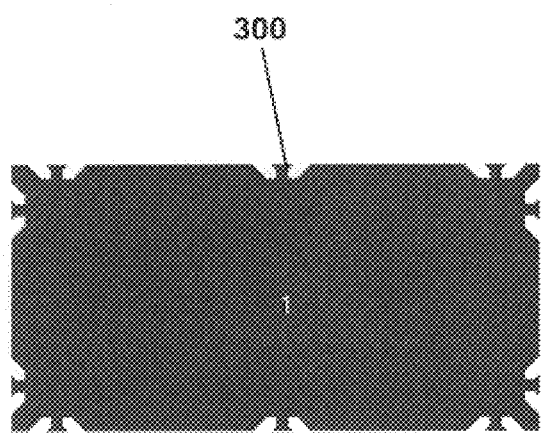
FIG. 3 is a block diagram illustrating a concave support tab.
Figure 4:
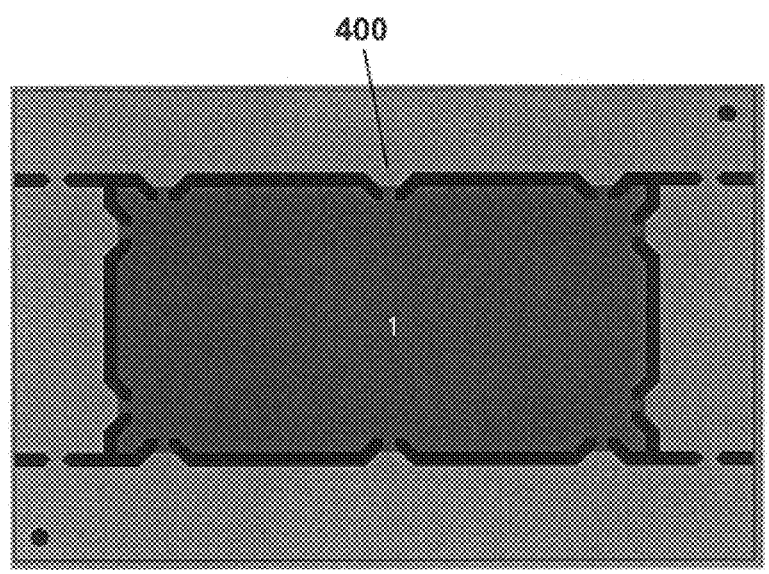
FIG. 4 is a block diagram illustrating how the PCB of FIG. 2 is routed in a panel.

As illustrated in FIG. 3, a support tab 300 may be equal to, or be inside a predetermined board outline. As illustrated in FIG. 4, this type of support tab is generally created by a pre-route pattern. This pattern normally has the router plunge 400 into the board outline where there are no components or copper concerns. As used throughout the description, these types of support tabs will be referred to as concave support tabs.

Under the current state of the art, both types of support tabs are generally designed at the end of the PCB design process, during the panel fabrication process, where a fabricator decides where support tabs should be placed based on a completed PCB design provided by a designer. Since these processes are not integrated, however, the placement of support tabs can often cause problems. Some of these problems require a redesign of the board to accommodate the support tabs. Other problems can never be remedied as they are not discovered until the board has been completely manufactured, and/or assembled into its final product enclosure.

One example, as discussed supra, is the problem caused by placing a protruding support tab beneath a protruding component. Other problems may be caused when support tabs are placed too closely to mounting holes or slots, or when the milling path of a concave support tab cuts open the copper traces and/or planes on the board.

In embodiments of the invention, the milling process for panelization is pushed to the early design process in order to eliminate design problems caused by improper milling. As used herein, the term "support tab" shall generally refer to the object for sustaining the weight of components placed on the board and for providing mechanical stability; and the term "pre-route" shall refer to a pattern that may be used for creating a support tab. Furthermore, while pre-routes have historically been associated with patterns for creating convex (i.e. FIG. 2) support tabs, pre-routes as used herein shall refer to patterns for creating either concave or convex support tabs.

PCB Designer For Creating Milling Paths

Figure 5:
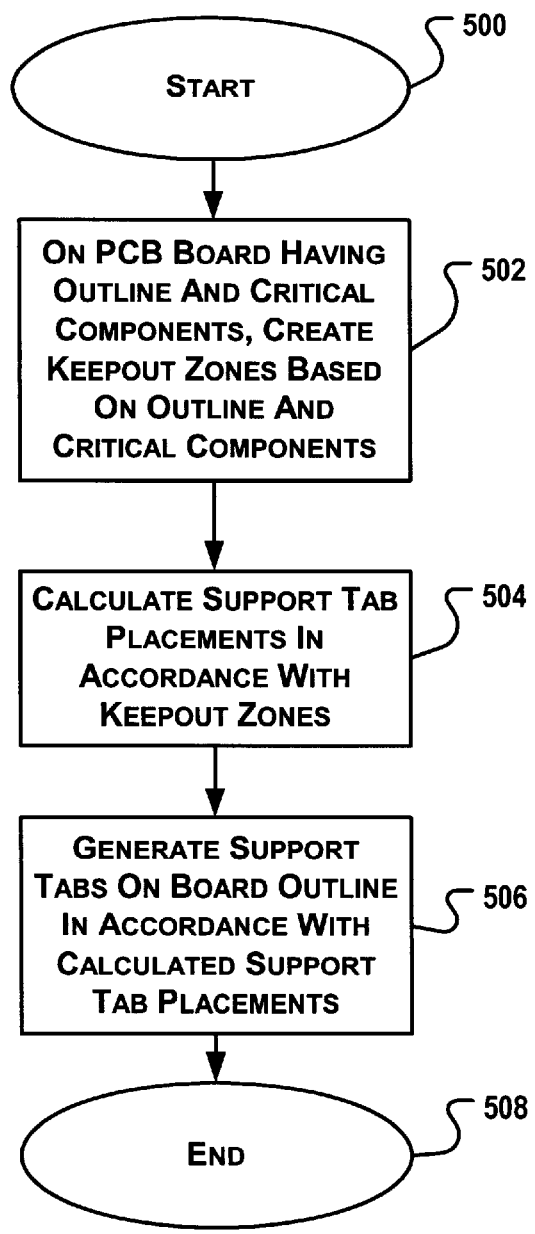
FIG. 5 is a flowchart illustrating a method for an intelligent and automated process for creating a milling path in accordance with general embodiments of the invention.

In embodiments of the invention, a process for creating milling paths is described that is both automated and intelligent. The process involves integrating the support tab creation part of the fabrication process into the PCB design process. As illustrated in FIG. 5, the method begins at block 500 and continues to block 502 where keepout regions are created for a PCB design having a PCB outline and critical components placed on the PCB design, where the keepout regions are defined based on the board outline and the placed critical components.

At block 504, support tab placement areas are calculated in accordance with the keepout regions, and at block 506, support tabs are generated on the PCB design in accordance with the calculated placement areas. The method ends at block 508. Embodiments of the invention may additionally include defining a PCB outline and/or placing critical components on the PCB design (not shown).

In embodiments of the invention, various modules or functions are referred to for performing the various processes of the described method. It should be understood by one of ordinary skill in the art that the processes may be performed by modules and/or by functions, and are not limited by the specific modules and functions referred to herein. It should be further understood that the processes are general processes, and are not limited to being performed by a specific module or function. Lastly, the various processes described herein may be performed by any PCB designer tool, such as Mentor Graphics Corporation's Expedition™ tool.

PCB Outline

A PCB outline may comprise segments, including line segments and arc segments. A line segment comprises two vertices, and an arc segment comprises an initial vertex, a midpoint vertex, and a final vertex (where the initial vertex and final vertex may also be considered end points). A PCB outline may be any shape, including a triangle, square, rectangle, or polygon. A PCB outline may be defined by 1) creating by a PCB outline from a PCB outliner module or function; or 2) importings a PCB outline from a mechanical design tool, such as ProEngineer™ by Parametric Technology Corporation or AutoCad™ by AutoDesk, Inc.

Figure 6:
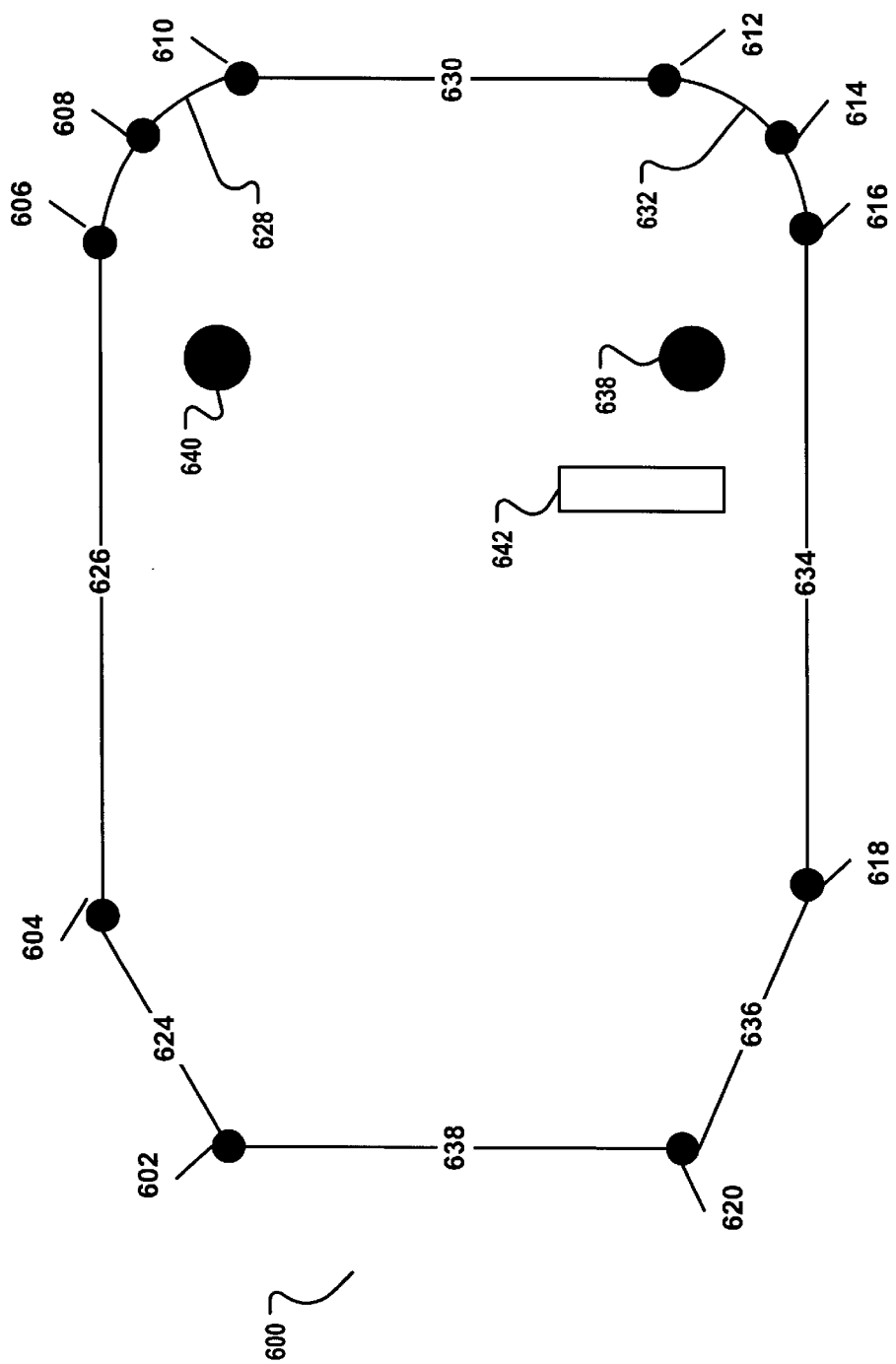
FIG. 6 is a block diagram illustrating a PCB outline, vertices, and segments.

A board outline is illustrated in FIG. 6. The board outline 600 comprises vertices 602, 604, 606, 608, 610, 612, 614, 616, 618, 620; six line segments 624, 626, 630, 634, 636, 638; and two arc segments 628, 632. The board also comprises internal mechanical features including two mounting holes 638, 640 and a slot 642. A mounting hole is a mechanical feature that is created by a single drill, which is typically not plated (but can be). A slot is a mechanical feature of a PCB which is typically created by a milling tool removing a non-copper area of the PCB with the purpose of improving the mechanical integrity of a component on the fully assembled PCB. As one of ordinary skill in the art would understand, mechanical features are not necessarily limited to mounting holes and slots, and may include similar features not mentioned herein, and which may be known in the future.

Critical Components

Figure 7:
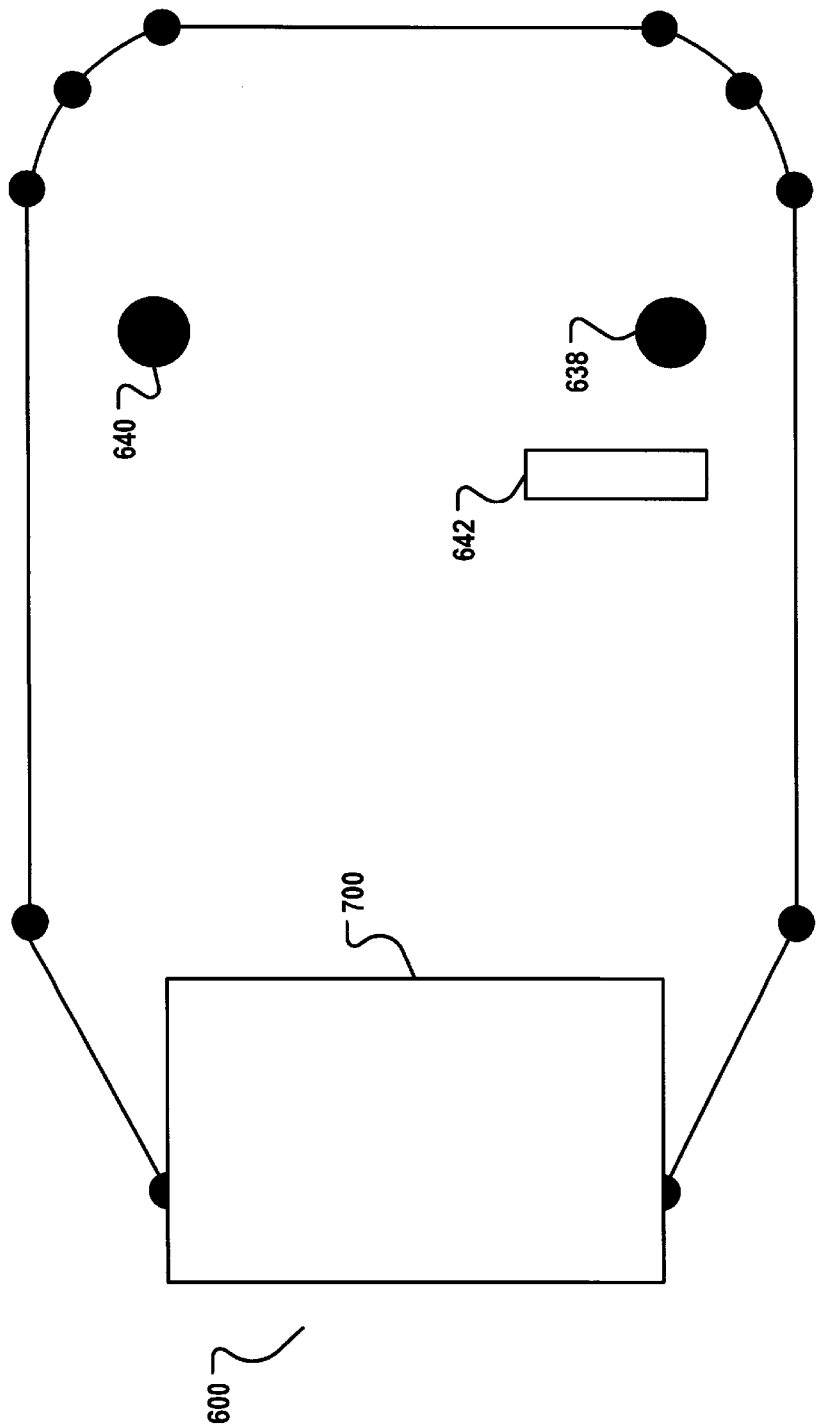
FIG. 7 is a block diagram illustrating a critical component on a PCB outline.

Once the board outline has been defined, a component place module or function of a PCB designer tool may be used to place critical components on the PCB design. Critical components comprise those components that have fixed placement—i.e., they must be placed on the PCB design at specific places. For example, as illustrated in FIG. 7, a critical component may comprise a connector 700, which must be placed on or near the board outline 600 to enable connectivity functionality. Other critical components include, but are not limited to, adjustable capacitors; displays (i.e., LCD (Liquid Crystal Display); LED (Light Emitting Diode)); potentiometers; shields (for EMI (Electro-Magnetic Interference) protection); switches; and testpoints.

Determining Keepout Regions

Figure 8:
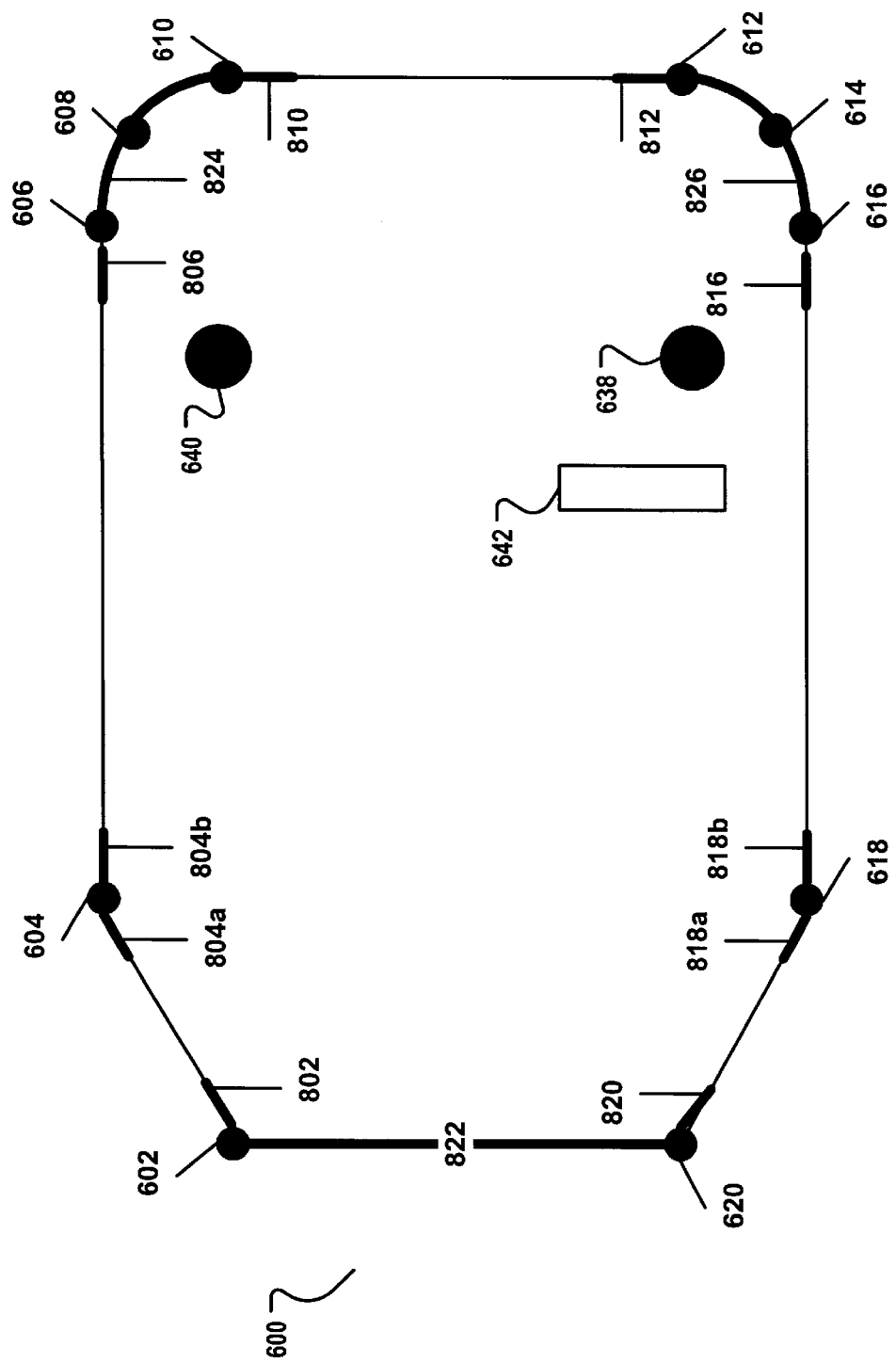
FIG. 8 is a block diagram illustrating keepout areas along a board outline.

Keepout regions are regions that will prohibit the placement of any support tabs, and may be created by a region protector module or function of a PCB designer tool. Keepout regions may be created along the board outline based on the defined board outline and placed critical components, if any. Since it is desirable to avoid compromising the board outline, keepout regions may be created around each vertex of the board outline. As illustrated in FIG. 8, the keepout region based on the board outline 600 comprises a predetermined distance 802, 804a, 804b, 806, 810, 812, 816, 818a, 816b, 820 on both sides of a vertex 604, 618, or on one side of vertices 602, 606, 610, 612, 616, 620 where the other side of these vertices comprise keepout regions as explained below. The predetermined distance may initially comprise a default setting, which can be modified to comprise a user-defined setting.

It is also desirable to create keepout regions around critical components when needed. Using the example given above, a keepout region 822 could be created for a connector that overhangs the board outline so as to avoid problems that can arise when protruding support tabs are placed underneath. In embodiments of the invention, keepout regions may also be defined around the entire run of arc segments 824, 826.

Additional keepout regions may be created based on internal mechanical features, such as mounting holes and slots, that may flex, fracture, or warp during the assembly and soldering process if support tabs are placed too closely to them. Therefore, embodiments of the invention allow users to create keepout regions around such mechanical features if such mechanical features are in critical proximity to the pre-routes. Critical proximity may be a default number and/or it may be user-defined.

These keepout regions may be calculated by a material stability formula (such as 2*(material thickness of the finished board), as one of ordinary skill would understand), where the resultant value is the measured distance between the closest vertex of any feature of the pre-route pattern (created by milling or drilling) to the closest vertex of an internal mounting hole or slot. This material stability formula may be a default distance and/or a user-defined distance.

Determining Sufficiency of Support Tab Placements

Figure 9:
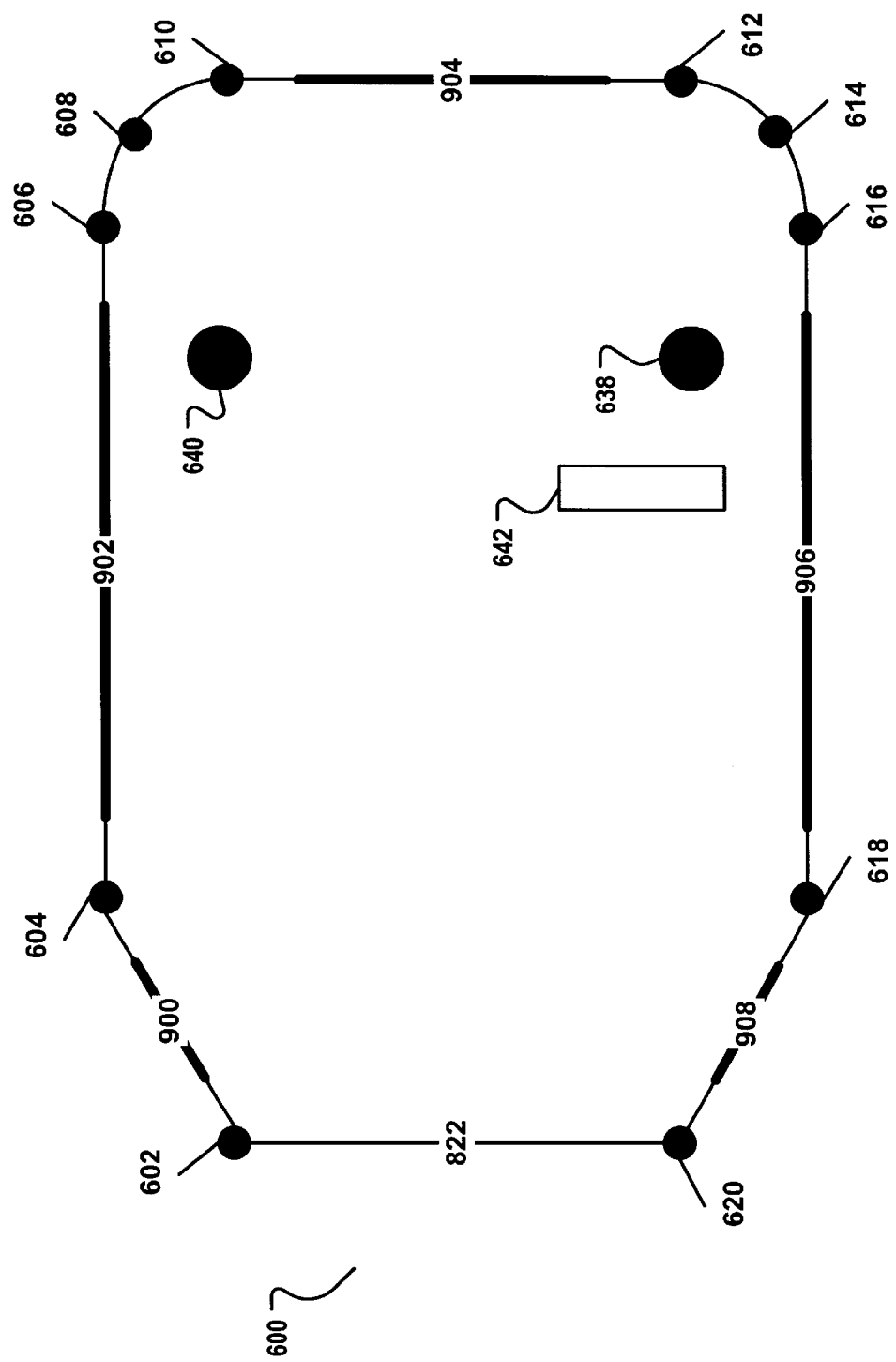
FIG. 9 is a block diagram illustrating non-keepout segments on a board outline.

When all keepout regions have been identified, a region analyzer module or function may determine if there is sufficient non-keepout area to place support tabs for the board prior to calculating the placement of the support tabs. FIG. 9 illustrates non-keepout segments 900, 902, 904, 906, 908 of the board outline. A non-keepout segment is defined as a line segment located between two keepout regions, or an arc segment located between two keepout regions, where support tabs may be placed, contrary to keepout regions. One way to make this determination is described below.

Figure 10:
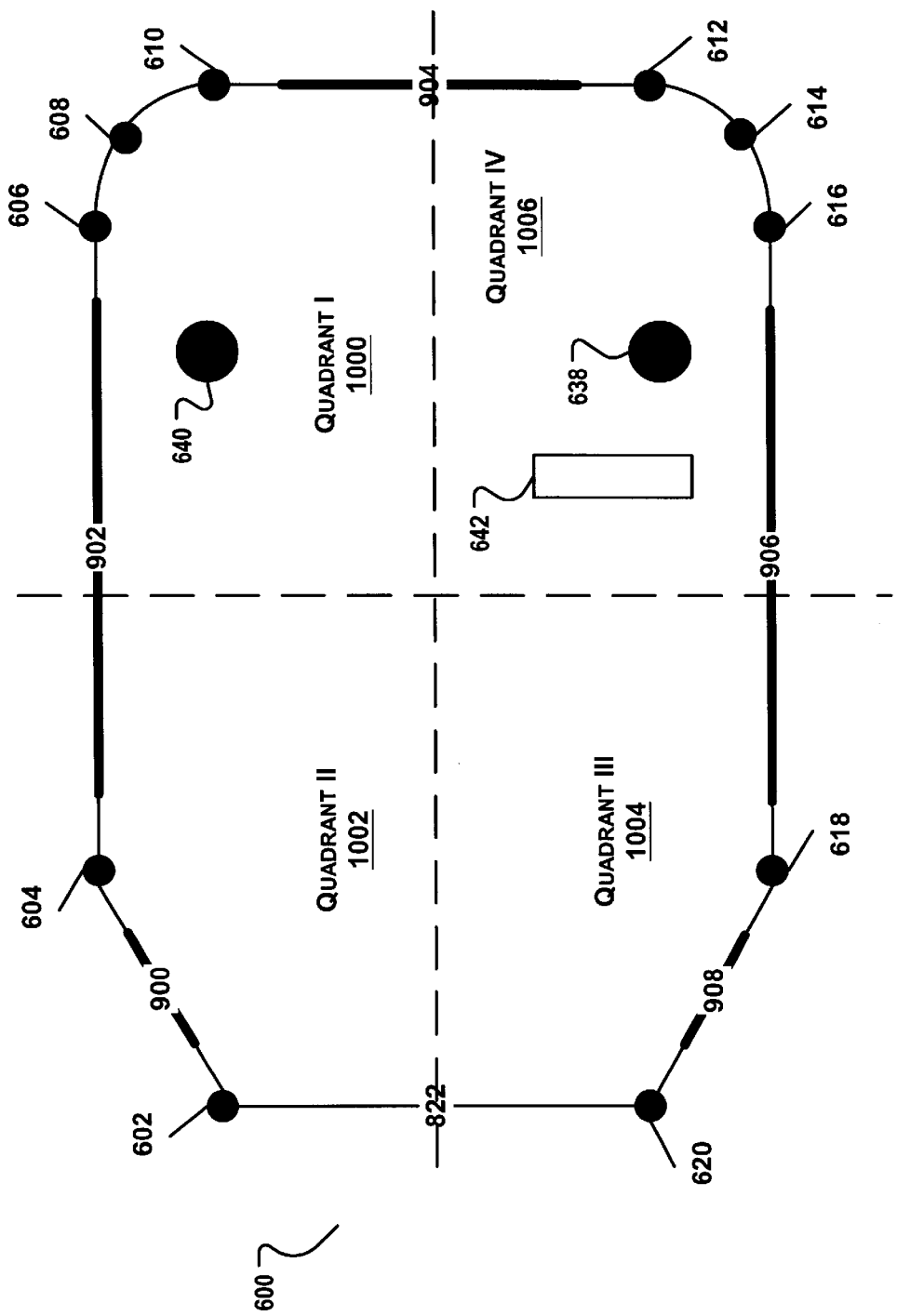
FIG. 10 is a block diagram of sections on the block diagram of FIG. 9 for determining sufficiency of non-keepout regions for placing support tabs.

A physical center of the board is determined, and a Cartesian coordinate is theoretically placed at this center as illustrated in FIG. 10 so that each section, (in an exemplary embodiment, a quadrant) may be evaluated as follows. For a given quadrant, the length of the total board outline is divided by a specified distance between support tabs. This support tab distance may be a default distance and/or a user-defined distance, and may be measured, for example, from the center of a first support tab to the center of a second support tab. The calculation determines the minimum number of support tabs to be placed along the unemcumbered (i.e., no keepout regions defined) portion of the board outline in the given quadrant. If there is a modulus, then the number of support tabs is increased by one.

A module or function may then calculate the minimum number of support tabs to be placed along encumbered (i.e., having keepout regions defined) portions of the board outline in the given quadrant. This calculation may be determined by calculating the total lengths of each of the non-keepout segments in the given quadrant, and dividing each non-keepout segment length by the specified distance between support tabs.

The calculation for a given non-keepout segment determines the minimum number of support tabs to be placed along the non-keepout segment of the board outline in the given quadrant. If there is a modulus, then the number of support tabs along the given non-keepout segment is increased by one. The total number of calculated support tabs (i.e., with or without a modulus) is then increased by one to account for an additional support tab at the end point of a keepout region.

If the total number of support tabs for all of the non-keepout regions in a given quadrant is greater than or equal to the total number of support tabs for the entire board outline length in the given quadrant, then a minimum number of support tabs can be sufficiently supported by the encumbered board configuration.

However, if the total number of support tabs for all of the non-keepout regions in a given quadrant is less than the total number of support tabs for the entire board outline length in the given quadrant, then the encumbered board configuration may potentially be insufficient to support the minimum number of support tabs. In embodiments of the invention, the ratio of supportable support tabs to minimum support tabs is calculated. If the ratio is less than some predetermined measure (i.e., such as a percentage, which can be a default measure or user-defined), then the user may be warned, and given an opportunity to redetermine keepout regions. Otherwise, it may be assumed that there is sufficient non-keepout space to accommodate the support tabs.

Figure 11:
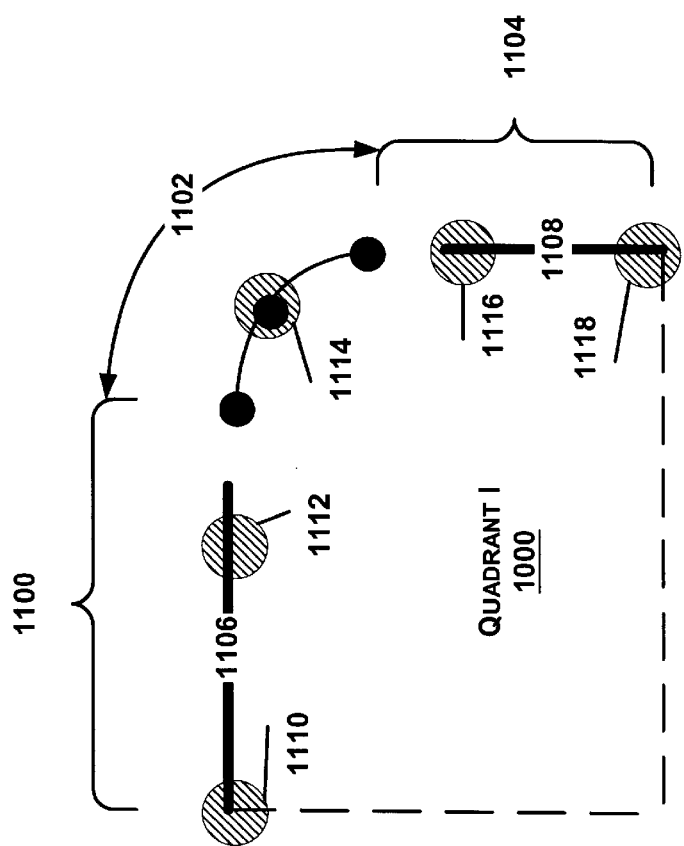
FIG. 11 is a block diagram of a single quadrant from the block diagram of FIG. 10 to illustrate a first example of determining sufficiency of non-keepout regions for placing support tabs within a single quadrant.
Figure 12:
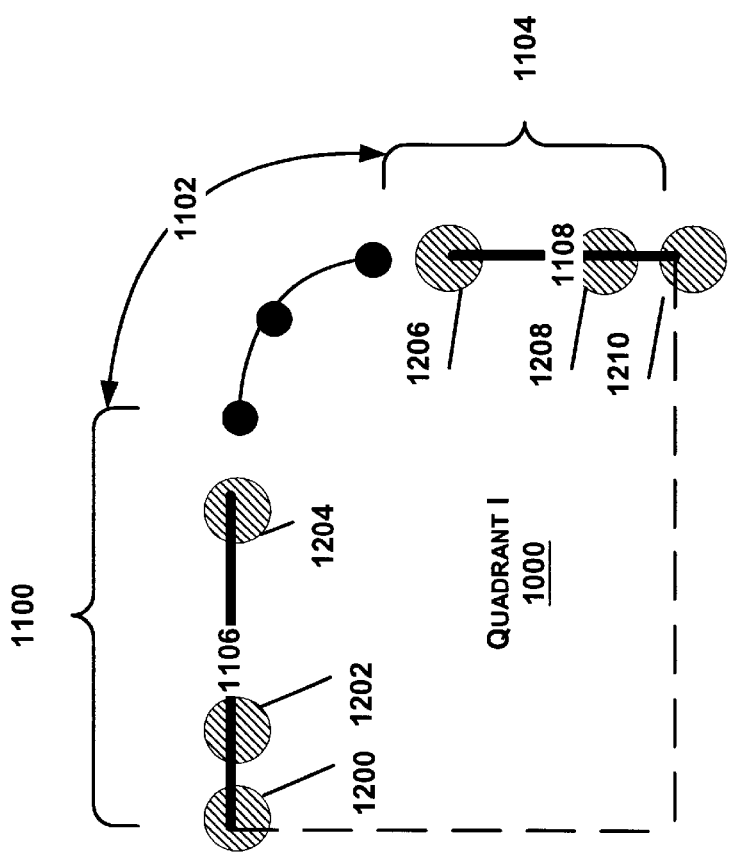
FIG. 12 is a block diagram further illustrating the first example of determining sufficiency of non-keepout regions for placing support tabs within a single quadrant as illustrated in FIG. 11.
Figure 13:
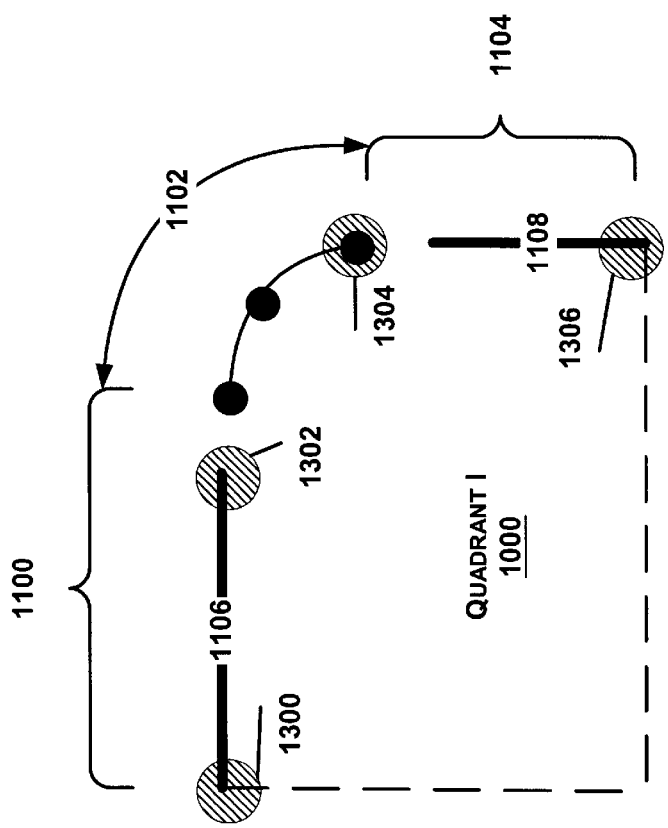
FIG. 13 is a block diagram of a single section from the block diagram of FIG. 10 to illustrate a second example of determining sufficiency of non-keepout regions for placing support tabs within a single quadrant.
Figure 14:
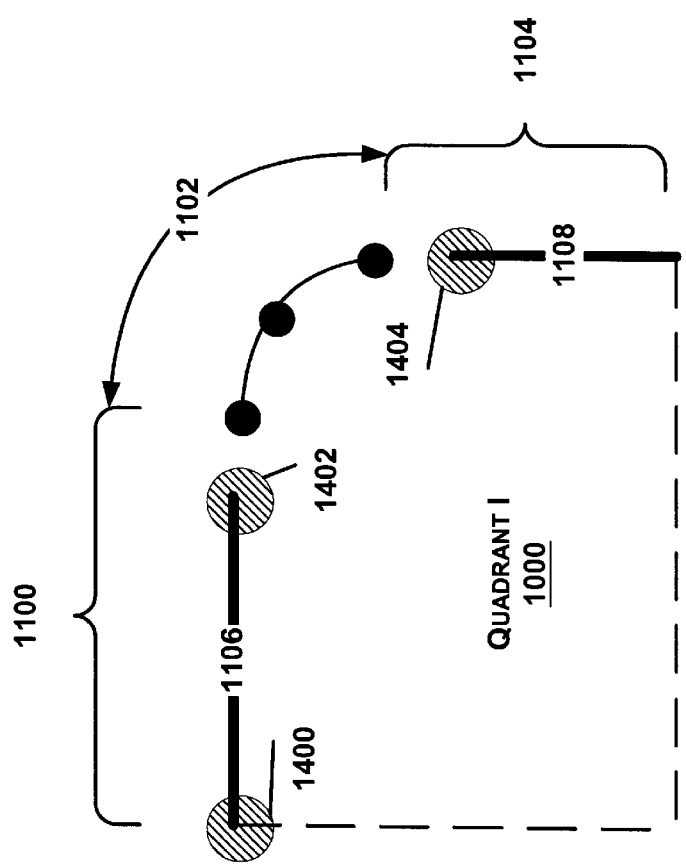
FIG. 14 is a block diagram further illustrating the second example of determining sufficiency of non-keepout regions for placing support tabs within a single quadrant as illustrated in FIG. 12.

FIGS. 11, 12, 13, and 14 are block diagrams of Quadrant 1 1000 of FIG. 10, where FIGS.11 and 13 illustrate a first example of determining the sufficiency of support tab placements where there exists sufficient space on the non-keepout areas to place a minimum number of support tabs; and FIGS. 12 and 14 illustrate a second example of determining the sufficiency of support tab placements where there is insufficient space on the non-keepout areas to place a minimum number of support tabs. FIGS. 11 and 13 illustrate the theoretical placement of support tabs along an unemcumbered board outline in a quadrant in accordance with a specified support tab distance; and FIGS. 12 and 14 illustrate the theoretical placement of support tabs along an encumbered board outline in a quadrant in accordance with a specified tab distance. In these examples, it should be assumed that total length of the board outline is as follows:

1100: 0.775" (where 1100 is measured from one edge of the quadrant to the middle of an end point vertex for the arc segment, for example).

1102: 0.707" (where 1102 is measured from an initial vertex to a final vertex, for example).

1104: 0.700" (where 1104 is measured from one edge of the quadrant to the middle of an end point vertex for the arc segment, for example).

for a total board outline length of 2.182". It should be further assumed for purposes of illustration that:

non-keepout line segment 1106 has a length of 0.700";

non-keepout line segment 1108 has a length of 0.650".

In a first example, as illustrated in FIG. 11, it is assumed that the specified distance between support tabs is 0.500". A minimum number of support tabs to be placed around the unemcumbered board outline of the quadrant is calculated to be 2.182/0.5=4.364, for 4 support tabs. Since there is a modulus, an additional support tab is calculated for a total of 5 support tabs 1110, 1112, 1114, 1116, 1118 that are theoretically placed along the unemcumbered board outline of the quadrant starting from a first edge of the quadrant (support tab 1110), and spacing them out in accordance with the specified support tab distance. When placement of a support tab falls out of the given quadrant, a last support tab 1118 is placed at the edge of the quadrant.

In FIG. 12, calculations are made to determine if there is sufficient non-keepout space to accommodate the minimum number of support tabs based on the specified support tab distance. For non-keepout region 1106, which is assumed to be 0.700" for purposes of illustration, 3 support tabs 1200, 1202, 1204 are theoretically placed on non-keepout region 1106 (0.700/0.500=1.4 for a first support tab; since there is a modulus, a second support tab is added; and a third support tab is added to be placed on the end of the keepout region). For non-keepout region 1108, 3 support tabs 1206, 1208, 1210 are also theoretically placed on non-keepout region 1108 (0.650/0.500=1.3 for a first support tab; since there is a modulus, a second support tab is added; and a third support tab is added to be placed on the end of the keepout region). The total number of support tabs on the non-keepout regions in this example is 6.

Since the non-keepout space accommodates more support tabs (i.e., 6) than the minimum number calculated (i.e., 4), it is initially assumed that the there is sufficient non-keepout space to place a minimum number of support tabs.

In a second example, as illustrated in FIG. 13, it is assumed that the specified distance between support tabs is 0.700". A minimum number of support tabs to be placed around the unemcumbered board outline of the a quadrant is calculated to be 2.182/0.7=3.117, for 3 support tabs. Since there is a modulus, an additional support tab is calculated for a total of 4 support tabs 1300, 1302, 1304, 1306 that are theoretically placed along the unemcumbered board outline of the quadrant starting from a first edge of the quadrant (support tab 1300), and spacing them out in accordance with the specified support tab distance. When placement of a support tab falls out of the given quadrant, a last support tab 1306 is placed at the edge of the quadrant.

In FIG. 14, calculations are made to determine if there is sufficient non-keepout space to accommodate the minimum number of support tabs based on the specified support tab distance. For non-keepout region 1106, which is assumed to be 0.700" for purposes of illustration, 2 support tabs 1400, 1402 are theoretically placed on non-keepout region 1106 (0.700/0.700=1 for a first support tab; and a second support tab is added to be placed on the end of the keepout region). For non-keepout region 1108, 1 support tab 1108 is also theoretically placed on non-keepout region 1108 (0.650/0.700=0.92: since there is no integer, no support tabs are added for the modulus; and a single support tab 1108 is added to be placed on the end of the keepout region). The total number of support tabs on the non-keepout regions in this example is 3.

In this case, since the non-keepout space accommodates less support tabs (i.e., 3) than the minimum number calculated (i.e., 4), it is then determined if this ratio is less than a predetermined measure, such as 75%. If it is, then the user is warned, and may be given an opportunity to reconfigure the keepout regions, and/or the default distance, for example. If the calculated ratio is greater than or equal to the predetermined measure, then it is assumed that sufficient non-keepout space exists to accommodate support tabs, and support tabs can then be calculated based on the specified distance, and added to the board outline if desired.

Calculating Support Tab Placements

Support tab placements can then be calculated by a support tab calculator module or function based on the non-keepout regions. One way to calculate the placements is to calculate support tabs along each non-keepout segment 900, 902, 904, 906, 908 (FIG. 9) of the board outline. In this manner, support tabs can be methodically placed along the board outline while maintaining specified distances from components and other fragile objects on the PCB design.

To calculate the number of support tabs that can be placed on a line segment, a distance formula (such as SQRT($(x_2-x_1)(y_2-y_1)$), where x and y are coordinates on a plane of the PCB design, as one of ordinary skill in the art would understand) may be used and is then divided a by specified distance between support tabs.

To calculate the number of support tabs that can be placed on an arc segment, an arc formula (such as Angle of Arc/360*2(pie)) may be used, and then divided by the specified distance between support tabs. Again, the distance may be a default distance and/or a user-defined distance. (For more complex arcs, advanced methods involving calculus may be used. However, discussion of such methods are omitted herein so as to not obscure discussion of the invention.)

If the support tab calculation produces a modulus (a remainder), it is then determined if the remainder exceeds a tolerance level. If the remainder exceeds a tolerance level, then an additional support tab is added, and the support tab placement is recalculated based on the number of calculated support tabs, including the additional one, and the segment length. If the remainder does not exceed a tolerance level, then the current spacing is modified to accommodate the tolerance.

For example, the first remainder is divided by the specified support tab distance between the pre-routes. If the resulting number, the second remainder, is less than a tolerance level, say 5%, then the current spacing is modified to accommodate the tolerance. If the second remainder is greater than the tolerance level, then the placement of the support tabs is recalculated by a formula such as (Total distance of available length/Number of pre-routes).

In embodiments of the invention, sufficiency of support tabs actually placed may be determined after the support tabs are calculated in lieu of or in addition to a prior analysis as discussed above. In such embodiments, once the support tabs are generated in accordance with the specified support tab distances, they can be compared to the minimum number of support tabs that should be placed along the board outline in each quadrant. As discussed, supra, if the ratio is less than some predetermined measure, the user may be warned and encouraged to place more support tabs on the board outline accordingly.

Placing Support Tabs On PCB Design in Accordance With Calculated Support Tabs A support tab placement module or function can be used to place support tabs on the PCB design where support tab placements were calculated by generating the support tabs and then placing them on the PCB design. Support tabs may be generated based on pre-route patterns (system defaults or user-defined, for example), or they may be generic symbols which may be later customized by the user. Components and routes may then be placed on the PCB design in accordance with, for example, route keepout regions (region of the PCB design where routes may not be placed within) and placement keepout regions (region of the PCB where components may not be placed within).

Upon completion of the panel (i.e., completion of all PCB designs on a given panel), a milling machine can cut out the boards along the milling path which now has incorporated support tabs.

Modifying Pre-Routes

Users may additionally have the option of modifying support tabs that were placed on the PCB design. After the support tabs are calculated and the generated on the PCB design, users may change the placement of the support tabs by deleting them, adding more, or modifying currently placed support tabs. For example, the user may change the support tab from a concave support tab to a convex support tab, or the user may change the pre-route pattern.

User-Defined Variables

In embodiments of the invention, the tool for implementing the methods as described allows for many user-defined variables. Some have already been discussed, including distance between support tabs, keepout distance around mechanical features, and keepout distance around vertices. Users may additionally supply information such as router direction and pre-route pattern. Additionally, users may save settings as milling rules that can be accessed at a later time.

If a user at anytime makes a critical change to the PCB design, such as by altering the shape of the board or relocating a critical component, support tab placements are automatically recalculated based on such modifications. However, since these modifications are still made in the design process, they are preferred over any modifications that would otherwise have to be made during the fabrication (or later) stage.

Stress Analysis

During the PCB design process, as a component is placed on the PCB design, stress analysis may be performed on the PCB design to determine the effect of the component (i.e., weight, size) on the board, and the effect of the component on the currently placed support tabs. Stress analysis involves structural element and design analysis, which can be performed with finite element modeling software.

For example, if stress analysis tests determine that a component's location will compromise the integrity of the design during the assembly and/or soldering process (i.e., a board within a panel warping from the heat of the wave-soldering process), the user may be notified and allowed to modify the PCB design. The user may modify the PCB design by adding support tabs, for example, or by moving the component to a different location. Stress analysis may be performed recursively on the PCB design for a given component until stress analysis tests pass. In embodiments of the invention, currently available stress analysis tools (such as Algor, Inc., Mechanical Event Simulation (MES)) are compatible with the methods described herein, requiring little or no modification to the tools.

If it is determined that the placement of a component or components may cause problems regardless of where they are placed, or if it is determined that the entire panel has excessive mass, recommendations can be made as to the usage of panel aids used during the fabrication process that can reduce the extent of such problems.

Conclusion

Therefore, embodiments of the invention describe a milling path creation process that is pushed to the early design process. Embodiments of the invention are designed to eliminate design problems caused by improper milling and support tab placement. Furthermore, embodiments of the invention alleviate and/or eliminate the potential loss of time and money that is spent on getting a product to market when errors are discovered late in or after the PCB manufacturing process.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method to integrate a milling path into a printed circuit board (PCB) design, comprising:
   on a PCB design having a PCB outline and critical components placed thereon, creating keepout regions based on the PCB outline and placement of critical components;
   calculating support tab placements in accordance with the keepout regions; and
   placing support tabs on the PCB design by generating support tabs on the PCB outline based on the calculated support tab placements.

2. The method of claim 1, additionally comprising determining if non-keepout regions of the PCB design have sufficient space for placing support tabs.

3. The method of claim 1, additionally comprising:
   a. placing a component on the PCB design;
   b. performing stress analysis on the PCB design having the placed component;
   c. if stress analysis fails:
      i. modifying the placed support tabs; and
      ii. repeating the method at 3(b) until stress analysis passes; and
   d. repeating the method at 3(a) until there are no more components to be placed.

4. The method of claim 1, additionally comprising defining locations for internal mechanical features, and creating additional keepout regions based on the internal mechanical features.

5. A method to integrate a milling path into a printed circuit board (PCB) design, comprising:
   defining a PCB outline of a PCB design;
   placing critical components on the PCB design;
   creating keepout regions based on the PCB outline and placement of critical components;
   calculating support tab placements in accordance with the keepout regions; and
   creating pre-routes on the PCB design based on the calculated support tab placements.

6. The method of claim 5, additionally comprising determining if non-keepout regions of the PCB design have sufficient space for placing support tabs.

7. The method of claim 6 additionally comprising:
   e. placing a component on the PCB design;
   f. performing stress analysis on the PCB-design having the placed component;
   g. if stress analysis fails:
      i. modifying the created pre-routes; and
      ii. repeating the method at 3(b) until stress analysis passes; and
   h. repeating the method at 3(a) until there are no more components to be placed.

8. The method of claim 5, additionally comprising defining locations for internal mechanical features, and creating additional keepout regions based on the internal mechanical features.

9. The method of claim 8, wherein the internal mechanical features comprise at least one of mounting holes and slots.

10. A method to create pre-routes along the outline of a printed circuit board (PCB) design, comprising:
    creating a first set of keepout regions on the PCB design, the first set of keepout regions based on a board outline of the PCB design;
    creating a second set of keepout regions on the PCB design, the second set of keepout regions based on placement of critical components on the PCB design;
    determining if internal mechanical features exist on the PCB design;
    if internal mechanical features on the PCB design exist, determining if they are in critical proximity to the border;
    if there are internal mechanical features that are in critical proximity to the border, then creating a third set of keepout regions on the PCB design, the third set of keepout regions based on the internal mechanical features that are in critical proximity to the border; and
    calculating support tab placements along the PCB outline in accordance with the first, second, and third set of keepout regions.

11. The method of claim 10, wherein the PCB outline comprises at least one of a line segment and an arc segment, and said calculating support tab placements along the PCB outline comprises:
    for each line segment on the outline:
       calculating a line segment length; and
       calculating a number of support tabs that can be placed on the line segment length given a specified support tab distance between support tabs; and
    for each arc segment on the outline:
       calculating an arc segment length; and
       calculating a number of support tabs that can be placed on the arc segment length given the specified support tab distance between support tabs.

12. The method of claim 11, wherein said calculating a number of support tabs that can be placed on the segment length comprises dividing the segment length by the specified support tab distance.

13. The method of claim 12, wherein if the calculated number produces a modulus, then determining if the modulus is high enough to pass a tolerance threshold.

14. The method of claim 10, additionally comprising determining if any of the placed support tabs are to be removed.

15. An apparatus comprising:
- a region protector to create keepout regions along a printed circuit board (PCB) outline of a PCB design having critical components placed thereon;
- a support tab calculator to calculate support tab placements along the PCB outline in accordance with the keepout regions; and
- a support tab placement to place calculated support tabs along the PCB outline.

16. The apparatus of claim 15, additionally comprising a support tab modifier to enable a user to modify the placement of the support tabs along the PCB outline.

17. The apparatus of claim 15, additionally comprising a region analyzer to determine if there is sufficient area on non-keepout regions to place a minimum number of support tabs.

18. The apparatus of claim 17, wherein the region analyzer determines if there is sufficient area on non-keepout regions to place a minimum number of support tabs within a section of the PCB design.

19. A machine-readable medium having stored thereon data representing sequences of instructions, the sequences of instructions which, when executed by a processor, cause the processor to perform the following:
- create a PCB outline of a PCB design;
- allow placement of critical components on the PCB design;
- create keepout regions based on the PCB outline and placement of critical components;
- calculate support tab placements in accordance with the keepout regions; and
- create pre-routes on the PCB design based on the calculated support tab placements.

20. The machine-readable medium of claim 19, additionally comprising determining if non-keepout regions of the PCB design have sufficient space for placing support tabs.

21. The machine-readable medium of claim 19, additionally comprising defining locations for internal mechanical features, and creating additional keepout regions based on the internal mechanical features.

22. The machine-readable medium of claim 21, wherein the internal mechanical features comprise at least one of mounting holes and slots.

23. A method to integrate a milling path into a printed circuit board (PCB) design, comprising:
- on a PCB design having a PCB outline and critical components placed thereon, the step of creating keepout regions based on the PCB outline and placement of critical components;
- the step of calculating support tab placements in accordance with the keepout regions; and
- the step of placing support tabs on the PCB design by generating support tabs on the PCB outline based on the calculated support tab placements.

24. The method of claim 23, additionally comprising the step of determining if non-keepout regions of the PCB design have sufficient space for placing support tabs.

25. An apparatus comprising:
- means for creating keepout regions along a printed circuit board (PCB) outline of a PCB design having critical components placed thereon;
- means for calculating support tab placements along the PCB outline in accordance with the keepout regions; and
- means for placing calculated support tabs along the PCB outline.

26. The apparatus of claim 25, additionally comprising means for enabling a user to modify the placement of the support tabs along the PCB outline.

27. The apparatus of claim 25, additionally comprising means for determining if there is sufficient area on non-keepout regions to place a minimum number of support tabs.

* * * * *

UNITED STATES PATENT AND TRADEMARK OFFICE
CERTIFICATE OF CORRECTION

PATENT NO. : 6,678,878 B2
DATED : January 13, 2004
INVENTOR(S) : Daniel J. Smith et al.

It is certified that error appears in the above-identified patent and that said Letters Patent is hereby corrected as shown below:

Title page,
Item [56], References Cited, OTHER PUBLICATIONS, please insert:
-- Coombs, Jr., Clyde F., Printed Circuits Handbook, 4$^{th}$ Ed., Ch. 22, Machining and Routing, McGraw-Hill (1996) --
Item [57], ABSTRACT,
Line 4, please delete the second occurrence of "components".

Signed and Sealed this

Third Day of August, 2004

JON W. DUDAS
*Acting Director of the United States Patent and Trademark Office*